United States Patent
Rupp et al.

(10) Patent No.: US 10,020,226 B2
(45) Date of Patent: Jul. 10, 2018

(54) METHOD FOR FORMING A SEMICONDUCTOR DEVICE AND A SEMICONDUCTOR DEVICE

(71) Applicant: Infineon Technologies AG, Neubiberg (DE)

(72) Inventors: Roland Rupp, Lauf (DE); Wolfgang Lehnert, Lintach (DE); Francisco Javier Santos Rodriguez, Villach (AT); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/645,402

(22) Filed: Jul. 10, 2017

(65) Prior Publication Data
US 2017/0309517 A1    Oct. 26, 2017

Related U.S. Application Data

(63) Continuation of application No. 15/224,099, filed on Jul. 29, 2016, now Pat. No. 9,704,750.

(30) Foreign Application Priority Data

Jul. 31, 2015    (DE) ................ 10 2015 112 649

(51) Int. Cl.
*H01L 23/48*    (2006.01)
*H01L 21/78*    (2006.01)
(Continued)

(52) U.S. Cl.
CPC .... *H01L 21/7813* (2013.01); *H01L 21/76251* (2013.01); *H01L 21/78* (2013.01);
(Continued)

(58) Field of Classification Search
USPC ............................................ 438/17; 257/758
See application file for complete search history.

(56) References Cited

U.S. PATENT DOCUMENTS

| | | |
|---|---|---|
| 2004/0113283 A1 | 6/2004 | Farnworth et al. |
| 2012/0187412 A1 | 7/2012 | D'Evelyn et al. |
| | (Continued) | |

FOREIGN PATENT DOCUMENTS

| | | |
|---|---|---|
| JP | 2002-076326 A | 3/2002 |
| JP | 2010-238911 A | 10/2010 |
| | (Continued) | |

OTHER PUBLICATIONS

Office Action communication of the German Patent and Trademark Office for Appln. Ser. No. 102015112649.4, dated Mar. 7, 2016.
(Continued)

*Primary Examiner* — Timor Karimy
(74) *Attorney, Agent, or Firm* — Slater Matsil, LLP (57) ABSTRACT

In certain embodiments, a semiconductor device includes a plurality of semiconductor chips. Each semiconductor chip comprises a semiconductor body having a first side and a second side opposite the first side, a graphite substrate bonded to the second side of the semiconductor body and comprising an opening leaving an area of the second side of the semiconductor body uncovered by the graphite substrate, and a back-side metallization arranged in the opening of the graphite substrate and electrically contacting the area of the second side. The semiconductor device further includes a plurality of separation trenches each separating one of the plurality of semiconductor chips from an adjacent one of the plurality of semiconductor chips.

20 Claims, 5 Drawing Sheets

(51) Int. Cl.
    *H01L 21/66*           (2006.01)
    *H01L 29/16*           (2006.01)
    *H01L 29/20*           (2006.01)
    *H01L 21/762*          (2006.01)

(52) U.S. Cl.
    CPC .......... *H01L 22/14* (2013.01); *H01L 29/1608* (2013.01); *H01L 29/2003* (2013.01); *H01L 2224/48091* (2013.01); *H01L 2224/48247* (2013.01); *H01L 2924/181* (2013.01)

(56) References Cited

U.S. PATENT DOCUMENTS

2014/0225125 A1     8/2014    Berger et al.
2015/0171045 A1     6/2015    Berger et al.

FOREIGN PATENT DOCUMENTS

JP       2010-251632 A     11/2010
JP       2012-146694 A      8/2012
WO     2013-054580 A1     4/2013

OTHER PUBLICATIONS

Office Action Communication of the German Patent and Trademark Office re: File Reference 20898P-DE, dated Jul. 3, 2016.

METHOD FOR FORMING A SEMICONDUCTOR DEVICE AND A SEMICONDUCTOR DEVICE

CROSS-REFERENCE TO RELATED APPLICATION

This application is a continuation of U.S. application Ser. No. 15/224,099, filed Jul. 29, 2016, and entitled "A Method for Forming a Semiconductor Device and a Semiconductor Device," now U.S. Pat. No. 9,704,750, issued Jul. 11, 2017, which claims priority to German Application Serial No. 102015112649.4 filed Jul. 31, 2015, and entitled "A Method for Forming a Semiconductor Device and a Semiconductor Device."

TECHNICAL FIELD

Embodiments of the present invention relate to a method for forming a semiconductor device, in particular to a method for forming wide band-gap semiconductor devices on wafer-level, and a semiconductor device.

BACKGROUND

In order to improve the device characteristics of semiconductor devices attempts have been made to reduce the final thickness of semiconductor material. In particular for power semiconductor devices, it is often desired that the semiconductor body of such devices has a thickness which is just sufficient for accommodating the device or circuit.

The manufacturing and handling of thin semiconductor chips and wafers is often complicated since the brittle semiconductor material such as silicon carbide (SiC), once thinned, is prone to breaking. Further, monocrystalline wide band-gap materials are comparatively expensive. To improve the mechanical stability of thin semiconductor material, carrier systems have been developed. For example, a supported wafer may be formed by bonding a monocrystalline SiC substrate to a carrier wafer and subsequent peeling the monocrystalline SiC substrate from the carrier wafer while leaving part of the single-crystal substrate on the carrier wafer. However, unless a comparatively expensive poly-SiC carrier wafer is used, the electrical contact resistance and/or the thermal contact resistance between the monocrystalline SiC substrate and the carrier wafer and/or the electrical resistance and/or the thermal contact resistance of the carrier wafer may interfere with manufacturing. In addition, the high hardness of SiC typically poses a challenge for singulating the supported wafer. Furthermore, forming a contact metallization at the supported side of the monocrystalline SiC substrate may be complicated.

Other carriers often tolerate only moderate processing conditions. For example carriers glued to e.g. SiC-wafers are often limited to temperatures below 350° C. due to the limited thermal stability of the adhesive.

For these and other reasons there is a need for the present invention.

SUMMARY

According to an embodiment of a method of forming a semiconductor device, the method includes providing a wafer stack including a carrier wafer comprising graphite and a device wafer comprising a wide band-gap semiconductor material and having a first side and a second side opposite the first side and attached to the carrier wafer, defining device regions of the wafer stack, partly removing the carrier wafer so that openings are formed in the carrier wafer which are arranged within respective device regions and that the device wafer is supported by a residual of the carrier wafer, and further processing the device wafer while the device wafer remains supported by the residual of the carrier wafer.

According to an embodiment of a method of forming a semiconductor device, the method includes providing a wafer stack including a carrier wafer comprising graphite and a device wafer comprising a wide band-gap semiconductor material and having a first side and a second side opposite the first side and bonded to the carrier wafer, defining device regions of the wafer stack, forming openings in the carrier wafer so that areas of the second side in the device regions are uncovered and surrounded by a residual of the carrier wafer, and filling the openings in the carrier wafer with a conductive material to form respective conductive regions electrically contacting the areas of the second side.

According to an embodiment of a semiconductor device, the semiconductor device includes a semiconductor body having a first side and a second side opposite the first side and comprising a wide band-gap semiconductor material, a graphite substrate bonded to the second side of the semiconductor body and comprising an opening leaving an area of the second side of the semiconductor body uncovered by the graphite substrate, and a back-side metallization arranged in the opening of the graphite substrate, surrounded by the graphite substrate, and electrically contacting the area of the second side.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first side of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, manufacturing wide band-gap semiconductor devices on wafer level and the manufactured semiconductor devices.

When referring to semiconductor devices, at least two-terminal devices are meant, an example is a diode. Semiconductor devices can also be three-terminal devices such as a field-effect transistors (FETs), insulated gate bipolar transistors (IGBTs), junction field effect transistors (JFETs), and thyristors to name a few. The semiconductor devices can also include more than three terminals.

The term "wide band-gap semiconductor material" as used in this specification intends to describe a semiconductor material with a band-gap above 1 eV. Wide band-gap semiconductor materials such as SiC or GaN (gallium nitride) have a high breakdown field strength and high critical avalanche field strength, respectively. Accordingly, the doping of semiconductor regions can be chosen higher compared to lower band-gap semiconductor materials which reduces the on-state resistance Ron (also referred to as on-resistance Ron). In the following, embodiments are mainly explained with regard to SiC as wide band-gap semiconductor material.

The (wide band-gap) semiconductor devices (e.g. SiC semiconductor devices or GaN semiconductor devices) to be manufactured may be power semiconductor devices.

The term "power semiconductor device" as used in this specification intends to describe a semiconductor device on a single chip with high voltage and/or high current switching capabilities. In other words, power semiconductor devices are intended for high current, typically in the ampere range. Within this specification the terms "power semiconductor device" and "power semiconductor component" are used synonymously.

The term "field-effect" as used in this specification intends to describe the electric-field mediated formation of a conductive "channel" and/or control of conductivity and/or shape of the channel in a semiconductor region using an insulated gate electrode or a Schottky-gate electrode.

FIG. 1A to FIG. 5A illustrate processes of a method for forming a semiconductor device on wafer-level.

Figure 1A:
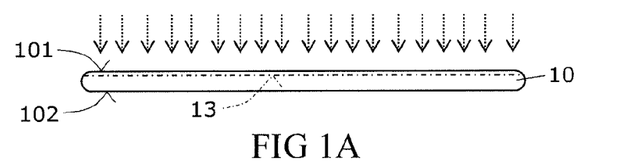
FIGS. 1A, 1B, 1C, 1D and 1E illustrate method steps of a method for forming a semiconductor device on wafer level in respective vertical cross-sections through wafers and wafer stacks, respectively, according to embodiments.

In a first process, a SiC donor wafer 10 is provided. The SiC donor wafer 10 may be of the 4H—SiC polytype having a C-side (also known as C-face) 101 and Si-side (also known as Si-face) 102. Further, the SiC donor wafer 10 may be cut from a SiC ingot.

In the exemplary embodiment illustrated in FIG. 1A showing a vertical cross-section through the donor wafer 10, particles, typically protons are implanted into the donor wafer 10 from the C-side 101 into a given depth. The particle implantation is represented by dotted arrows in FIG. 1A. The implantation depth can be adjusted by selecting the implantation energy.

The implantation of atoms or ions (typically gas ions such as protons), respectively, may cause the formation of a delamination layer 13 which can be a micro-bubble layer or micro-porous layer along the donor wafer 10.

The implantation depth defines the position of the delamination layer 13 and thus the thickness of a split layer 1 transferred to a carrier wafer 20. For example, 80 keV protons with a dose between $5*10^{16}$ cm$^{-2}$ and $8*10^{16}$ cm$^{-2}$ are mainly implanted to a depth of about 0.5-2 μm in SiC. Typically, the proton implantation energy is in range from about 50 keV to about 200 keV.

Figure 1B:
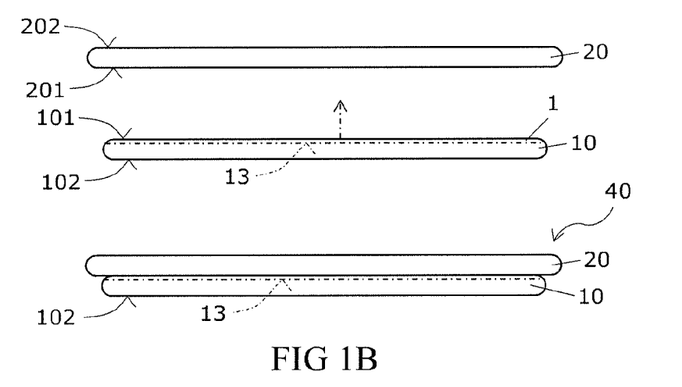

The carrier wafer 20 has a lower side 201 and an upper side 202 opposite the lower side 201 and includes or is formed by a graphite wafer. As illustrated in FIG. 1B, the carrier wafer 20 may have a larger size (extension in horizontal directions parallel the lower side 201 and/or the upper side 202) than the donor wafer 10. However, the carrier wafer 20 and the donor wafer 10 may also have the same extensions in horizontal directions.

Graphite is one of the three known allotropes of carbon. Within this specification the terms "graphite wafer" and "carbon wafer" are used synonymously.

To protect the graphite wafer against oxidation and to prevent the release of carbon particles, the carrier wafer 20 is typically a composite wafer formed by a graphite wafer (i.e. a wafer consisting of graphite or consisting essentially of graphite) that is surrounded by thin protecting layer, typically a thin SiC-layer. The SiC-layer of the carrier wafer 20 may have a thickness in a range from about 10 to about 2000 nm, more typically in a range from about 50 to about 500 nm. For sake of clarity, the protecting layer is not shown in the cross-sections of FIG. 1A and FIG. 1B.

The vertical extension of the carrier wafer 20 is typically in a range from about 10 μm to about 2500 μm, more typically in a range from about 50 μm. to about 1500 μm.

To form a wafer stack 40, the donor wafer 10 is typically attached with its implanted side, which is the C-side 101 in the exemplary embodiment, to the carrier wafer 20. In other embodiments, particles are implanted from the Si-side 102.

Attaching of the donor wafer 10 to the carrier wafer 20 is typically done by bonding. Accordingly, the donor wafer 10 and the carrier wafer 20 are joined through a bonding layer (also not shown in FIG. 1B) of the wafer stack 40.

The bond connection between the donor wafer 10 and the carrier wafer 20 is typically implemented such that it can withstand temperatures of at least about 1300° C. or of at least about 1450° C., e.g. temperatures of up to about 1600° C. used for a later so-called smart-cut layer transfer and an optional subsequent epitaxial growth.

The bonding may be accomplished by adhesive bonding. For this, a ceramic-forming polymer precursor may be used as adhesion layer. For example, the bonding may be carried out with a SiC ceramic-forming polymer precursor.

Alternatively, a spin-on-glass (SoG) may be used as adhesion layer. The use of SoG facilitates an initial low temperature bond, and can withstand the thermal stresses at high temperature (800-900° C.) where layer splitting may occur. A SoG-adhesion layer may only be used when the delamination layers 13 is sufficiently deep to allow later device manufacturing.

By the use of an adhesive ceramic-forming precursor (e.g. an adhesive SiC precursor) as the adhesive material, thermal mismatch between the active layer and the bonding zone and the undesired forming of reaction zones between bond layer and the active layer at high temperature processes may be avoided.

The ceramic-forming polymer precursor may comprise or consist (e.g. only) of carbon, silicon, and hydrogen. When the hydrogen diffuses during the bonding process, only polycristalline silicon carbide may remain. For example, the ceramic-forming polymer precursor may be an allyl-hydrido-polycarbosilan or another polycarbosilane.

In an embodiment one or both sides of the bonding sides or surfaces 101, 201 are coated with the ceramic-forming polymer precursor, followed by tempering between 200 to 700° C. For example, the tempering may be performed at a temperature of about 530° C. for about 4 hour.

As a first part of the bonding procedure, the ceramic-forming polymer precursor may be applied either to the carrier wafer 20 or the donor wafer 10. Alternatively, the ceramic-forming polymer precursor can be applied on the surfaces 101, 201 of both, the carrier wafer 20 and the donor wafer 10. The ceramic-forming polymer precursor can be applied e.g. by spin-on or spray processes.

As indicated by the dashed-dotted arrow in FIG. 1B, the carrier wafer 20 may thereafter be joined with the donor wafer 10 facing the sides 101, 201, where the polymer precursor was applied, to form a compound structure or wafer-stack 40. The so joined wafers 10, 20 may be subjected to a heat treatment (tempering) to form a stable and durable bond between the carrier wafer 20 and the donor wafer 10.

After the joining, the wafer stack 40 may be heated to form the bond. For example, temperatures ranges can be from about room temperature to about 600° C., or from 200-700° C.

Tempering the wafer stack 40 may be done in a first temperature range and subsequently in a second temperature range which is different than the first temperature range. The second temperature range can encompass temperatures higher than the first temperature range. The second temperature range can be, for example, from about 500° C. to about 1000° C. or even higher.

When using allyl-hydrido-polycarbosilane as precursor, it may be pyrolyzed to polycrystalline silicon carbide at high temperatures of e.g. 1500° C.-1700° C. (e.g. for the complete conversion of the precursor layer into polycrystalline SiC). Thus, the bonding layer between the SiC and the carrier wafer may become SiC itself during the bonding process, thus omitting effects which might arise when using other types of material and furthermore assuring electrical connectivity. For example, the bonding layer may be n-doped SiC.

Furthermore, a mechanically and thermally extremely stable bond connection may be formed by converting the bonding layer into SiC.

A strengthening of the bond connection and a separation (see below) of the SiC donor wafer 10 may occur at 700° C.-1800° C.

Thus, three tempering processes performed at different temperatures may be used. However, the tempering processes may also be combined into a single process having a given temperature profile. Further, the tempering may at least temporarily takes place under (compacting) pressure.

In an embodiment, the tempering takes place in an atmosphere including nitrogen and or a noble gas, e.g. a nitrogen atmosphere, an argon atmosphere, an atmosphere of nitrogen and argon, or an atmosphere of nitrogen and hydrogen. As nitrogen is a low donor in SiC, this may cause doping of the bond layer (e.g. polycrystalline SiC, which arises from the polymer) and an adjoining n monocrystalline SiC layer of the split layer during tempering, so that the vertical conductivity may be increased.

Figure 1C:
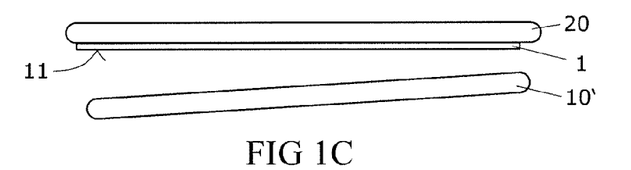

As illustrated in FIG. 1C, the donor wafer 10 is split along the internal delamination layer 13. This may be achieved by tempering at high temperature of at least 800° C. where splitting occurs. This may be a further tempering step, e.g. a de-bond annealing at about 1450° C. for about three hours, or done in parallel with hardening the bond connection as explained above with regard to FIG. 1B.

As a result a SiC split layer 1 (also referred to as smart-cut SiC-layer, first SiC-layer and lower semiconductor layer in the following) of the donor wafer 10 remains at the carrier wafer 20. In this way the split layer 1 is transferred from the donor wafer 10 to the the carrier wafer 20 (smart-cut layer transfer).

The graphite of the carrier wafer 20 can be one of turbostratic graphite, pyrolytic graphite, isostatically pressed graphite, and mixtures thereof. Graphite has a thermal expansion coefficient similar to that of SiC. This makes graphite a most promising carrier material for SiC. Graphite, however, is also suitable for other semiconductor materials such as GaN. Furthermore, the thermal expansion coefficent of graphite can be fine-tuned by its porosity.

Thereafter, the split layer 1 may be polished, for example by using a CMP-process (chemical mechanical polishing).

The split part 10' of the donor wafer 10 may be reused (e.g. more than 5 times or more than 10 times) as a donor, as it can be brought back to a suitable initial state for smart-cut layer transfer by polishing and/or epitaxy. This may be very cost-efficient.

Alternatively to the mentioned procedure, also other methods (e.g. oxygen implantation) may be suitable to separate and transfer the semiconductor layer.

Figure 1D:
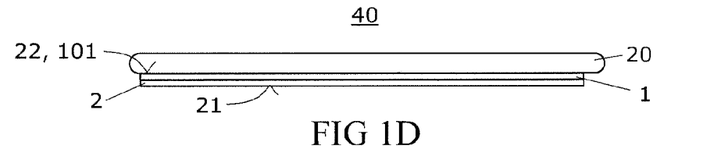

As illustrated in FIG. 1D, an epitaxial SiC-layer (in the following also referred to as further silicon carbide layer and upper semiconductor layer) 2 may subsequently be formed on the split layer 1 and at the Si-side 11 of the split layer 1, respectively. Epitaxial layer 2 and split layer 1 may form together a device wafer 1, 2.

Prior to epitaxial growth, the split layer 1 may have a thickness of 5 μm, 2 μm, 1 μm, or even only 0.5 μm.

In other embodiments (not illustrated in the figures), the split layer 1 has a thickness substantially corresponding to the thickness of the semiconductor body of the device to be manufactured.

As the epitaxy is performed at the Si-side 11 of the split layer 1, a high quality crystalline pattern of the epitaxial SiC-layer 2, even a more homogeneous crystalline pattern than that of the split layer 1, may be achieved. Furthermore, doping may be better controlled during epitaxy at the Si-side 11 compared to the C-side. Further, less (thickness) of the donor wafer 10 may be required. Accordingly, the process of transferring thin SiC-layers 1 of the donor wafer 10 can be repeated more often.

Further, several epitaxial SIC-layers 2 of different doping type, different doping concentration and/or different thickness may be formed on the split layer 1. For example, a highly n-doped first epitaxial SiC-layer may be formed at the split layer 1 and a low n-doped second epitaxial SIC-layer may be formed at the first epitaxial SIC-layer. The thickness of the first epitaxial SIC-layer may be chosen in accordance with mechanical stability requirements. The thickness and doping concentration of the second epitaxial SiC-layer may be chosen in accordance with device type and voltage class. For example, the second epitaxial SiC-layer may have a thickness of about 4.5 μm and a doping concentration of about $2*10^{16}/cm^3$ to form a drift region in a SiC-MOSFET of the 650V class to be manufactured.

The doping of the epitaxial SiC-layer(s) 2 may be adjusted during epitaxial growth but may also include dopant implantation(s) and a subsequent annealing.

Furthermore, prior to epitaxially depositing SiC, a mask with openings in the device regions D, for example a metal carbide mask, may be formed at the split layer 1. Accordingly, epitaxially SiC depositing is inhibited outside the device regions D. Accordingly, later singulation into several chips may be facilitated.

The processes explained with regard to FIG. 1A to FIG. 1D may also be described as providing a wafer stack 40 formed by a graphite comprising carrier wafer 20, typically a graphite core surrounded by a SiC protecting layer, and a device wafer 1, 2 made of a wide band-gap semiconductor material such as SiC or GaN. The device wafer 1, 2 has a first side 21 and a second side 22 opposite the first side 21. The second side 22 is attached to the carrier wafer 20.

In the above explained embodiments, in which the wafer stack 40 is formed using the smart-cut layer transfer technique, the second side 22 typically corresponds to a particle radiated side 101 of a monocrystalline SiC carrier wafer 10.

Figure 1E:
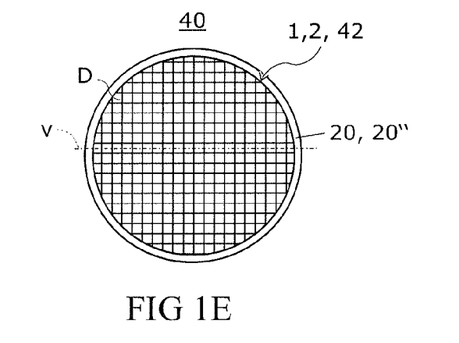

Thereafter, a plurality of device regions D separated from each other by singulation regions (also referred to as scribe line) may be defined. As shown in FIG. 1E corresponding to a schematic a top view on the wafer stack 40 and the device wafer 1, 2, respectively, the device regions D may be arranged in a checkerboard pattern.

In embodiments in which the device wafer 1, 2 and the carrier wafer 20 have substantially the same horizontal shape, the carrier wafer 20 is typically hidden by the device wafer 1, 2 in top view.

Figure 2A:
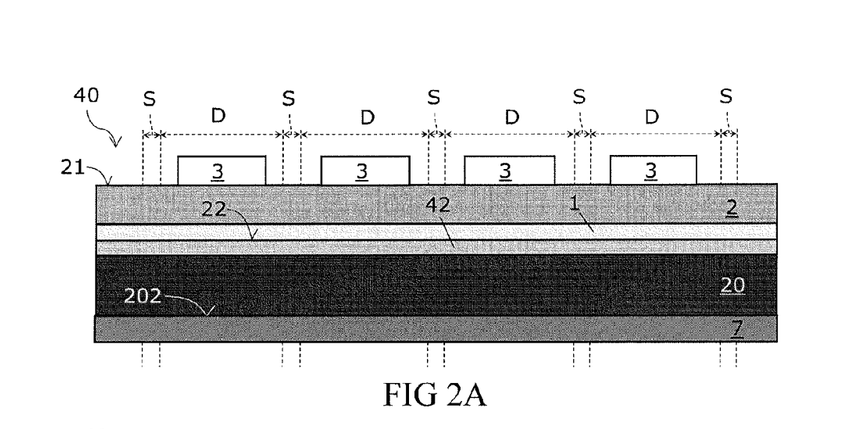
FIGS. 2A, 2B and 2C illustrate vertical cross-sections through a wafer stack in accordance with an embodiment method.

FIG. 2A illustrates a vertical cross-section through the wafer stack 40, e.g. along line v in FIG. 1E, after subsequent forming front-side metallizations 3 on the first side 21 in the device regions D and after forming a mask layer 7 on the carrier wafer 20, i.e. opposite the front-side metallizations 3 and the first side 21, respectively. In the following, the first side 21 and the second side 22 are also referred to as front-side 21 and back-side 22, respectively, of the device wafer 1, 2. Further, the first side 21 and the second side 22 may be substantially flat surfaces.

The mask layer 7 may be made of a nitride such as silicon nitride, for example a low-temperature nitride, or an oxide such as silicon oxide, for example a low-temperature nitride. Further, the mask layer 7 may be formed by chemical vapor deposition (CVD).

Prior to forming the mask layer 7, the carrier wafer 20 may be suitably thinned at the side 202. The thinning process can include, without being limited thereto, grinding, etching and polishing of the side 202.

Depending on the devices to be manufactured, one or more front-side metallizations 3 per device region D may be formed on the first side 21.

The front-side metallizations 3 are typically separated from each other. Forming the front-side metallizations 3 may include depositing one or more metal, e.g. Cu, or metal-like materials and subsequent masked etching.

Furthermore, passivation layers (not shown in FIG. 2A) may be formed on the first side 21 and or over the front-side metallizations 3. For example, an imid layer (not shown in FIG. 2A) overlapping with the front-side metallizations 3 may be arranged on the front-side metallizations 3.

Typically, at least one of the front-side metallizations 3 per device region D is in electric contact with, e.g. ohmic contact with the epitaxial SIC-layer 2. Alternatively, at least one of the front-side metallizations 3 per device region D forms a Schottky-contact with the epitaxial SiC-layer 2.

Even further, device manufacturing from the first side 21 may be almost or even completely finished prior to forming the mask layer 7.

Device manufacturing from the first side 21 may include processes like implanting dopants, annealing, etching trenches (also referred to as first trenches) from the first side 21 into the device wafer 1, 2, insulating sidewalls of the trenches, etching a wide trench (also referred to as second trench) into the device wafer 1, 2, forming insulated gate electrodes in the trenches, and/or forming insulated gate electrodes on and/or at the first side 21.

While the trenches are typically formed in the device areas D, the wide trench is typically formed outside the device areas D, i.e. in the singulation regions S. For example, the layout of the wide trench may, when seen from above, correspond to a lattice structure as shown by the vertical and horizontal lines in FIG. 1E. Accordingly, later singulating is facilitated.

The trenches and the wide trench are typically formed using common processes. Since an etching mask has typically an opening for the wide trench with a larger (horizontal) width compared to openings for the trenches, the wide trench typically also extends vertically deeper into the device wafer 1, 2 when common processes are used. In addition to the common processes, a further etching may be used to further deepen the wide trench while the first trenches are covered.

The singulation regions (scribe line) S between the device regions D in FIG. 2A may correspond to the vertical lines and horizontal lines shown in FIG. 1E.

In a subsequent process, the device wafer 1, 2 may be attached with the first side 21 to a reversible carrier 5, e.g. a glass substrate.

Figure 2B:
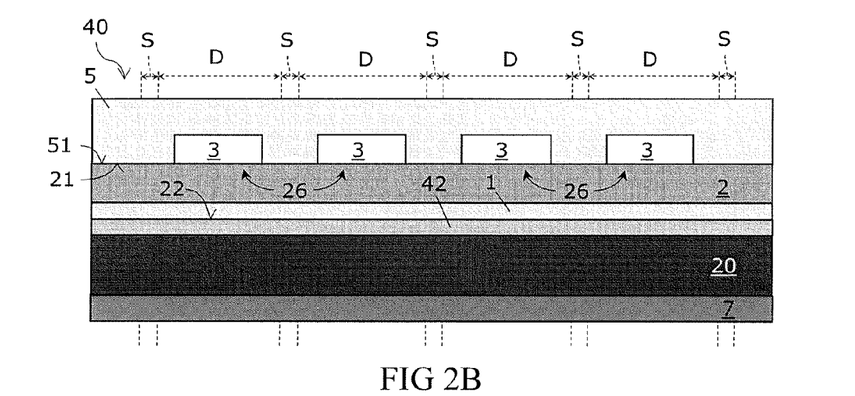

As illustrated in FIG. 2B, a pre-structured glass substrate 5 having a plurality of recesses or blind holes 26 at a bonding surface 51 of the glass substrate 5 may be used as reversible carrier. The recesses 26 can be formed in advance by suitable processes such as etching. The size of the recesses 26 are adapted to allow accommodation of the front-side metallizations 3 and any passivation layers that may be provided.

Alternatively, a substantially flat glass substrate may be used as reversible carrier. In one embodiment, the flat glass substrate is arranged on a passivation layer, typically an imid layer, formed on the front-side metallizations (3). Typically, a peripheral gap formed between the flat glass substrate and the first side (21) of the device wafer (1, 2) is sealed by an adhesive. To avoid any impact of adhesive residues in the device regions (D), the glue-bond between the flat glass substrate and the device wafer (1, 2) may only be formed in the peripheral area.

In the exemplary embodiment illustrated in FIG. 2B, the pre-structured glass substrate 5 is bonded with its bonding surface 51 to the first side 21 of the device wafer 1, 2 such that the front-side metallizations 3 are arranged within a respective recess 26 of the glass substrate 5. For alignment purposes, alignment marks arranged on the device wafer 1, 2 and the glass substrate 5 may be used.

In one embodiment, adhesive bonding using an adhesive is used for bonding the device wafer 1, 2 and the glass substrate 5. For example, acryl based adhesive or silicate adhesives can be used which are commercially available, for example, from Dow Corning. Depending on the nature of the glass adhesive, the adhesive bond connection (not shown in FIG. 2B) can withstand temperatures of up to 250° C. to 300° C. or even up to 450° C. for a short time in an inert atmosphere. This is sufficient for many of the manufacturing processes to which the semiconductor wafer is subjected for finishing the semiconductor components.

Thereafter, the mask layer 7 may be structured to form a hard mask 7 covering the singulation regions S and having openings 27 in the device regions D.

Figure 2C:
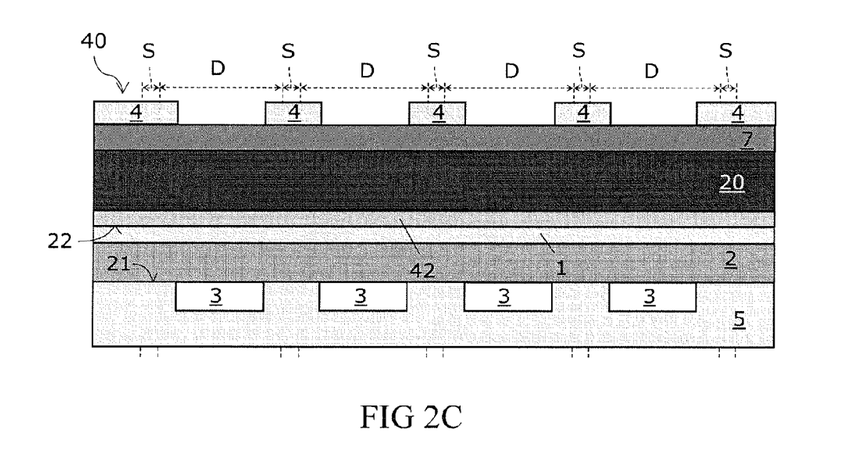

As illustrated in FIG. 2C, a photomask 4 may be formed on the the mask layer 7 for this purpose.

Figure 3A:
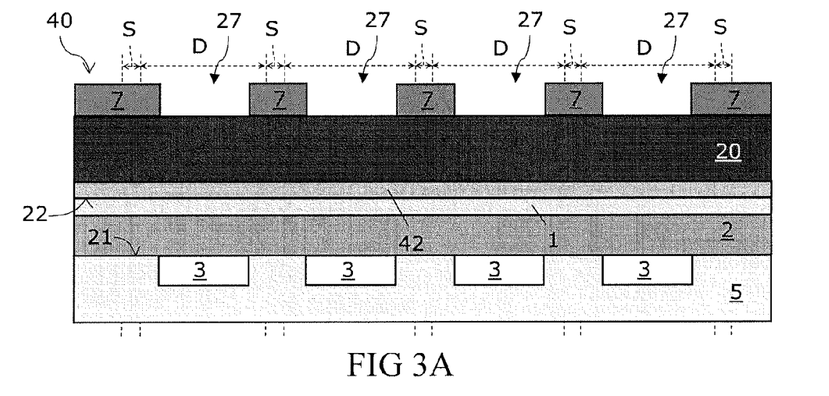
FIGS. 3A, 3B and 3C illustrate vertical cross-sections of wafer structures in accordance with an embodiment method.

FIG. 3A shows the resulting wafer structure 40 after masked etching of the mask layer 7 using the photomask 4 and subsequent removing of the photomask 4.

Thereafter, the exposed portion of the carrier wafer 20 may be removed.

Figure 3B:
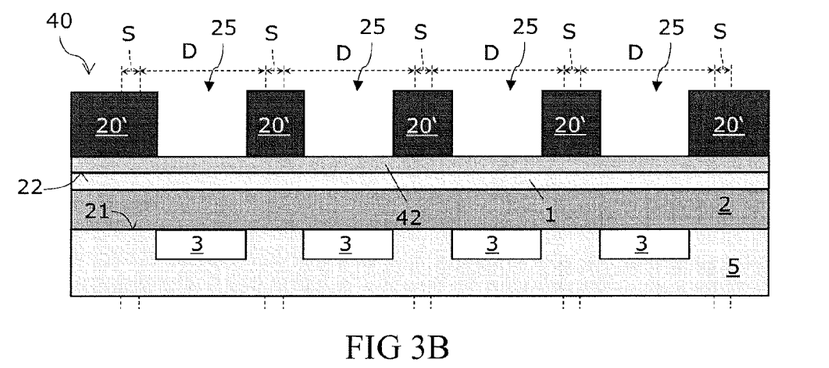

Accordingly, openings 25 are formed in the carrier wafer above the device regions D of the device wafer 1, 2 while a residual portion 20' of the carrier wafer 20 remains attached to the device wafer 1, 2. As shown in FIG. 3B illustrating the resulting wafer structure 40 after subsequent removing of the hard mask 7, the singulation regions S remain covered by the residual portion 20' of the carrier wafer 20.

When seen in top view onto the residual portion 20' of the carrier wafer 20 and the back-side 22, respectively, each device region D may partly overlap with the residual portion 20'. Further, each device region D is typically surrounded by a corresponding part of the residual portion 20' when seen in top view onto the residual portion 20'.

Accordingly, each device region D typically remains mechanically supported by the residual portion 20'. In the following, the residual 20' of the carrier wafer 20 is also referred to as structured graphite carrier 20'.

Typically, the structured graphite carrier 20' provides chip specific support allowing further processing on wafer level. Furthermore, the structured graphite carrier 20' facilitate singulation into individual semiconductor chips (see below).

Due to the mechanical support provided by the structured graphite carrier 20', the device wafer may be comparatively thin. For example, the silicon carbide layer 1 (including the optional epitaxial layer(s) 2) may have a thickness of less than 100 µm, less than 75 µm or even less than 50 µm, for example down to 5 µm, that can, due to the structured graphite carrier 20', be safely further processed from both sides. This allows flexible and cost efficient manufacturing of SiC-devices on wafer-level.

The structured graphite carrier 20' is typically contiguous. This ensures a particularly high mechanical stability.

In embodiments in which the carrier wafer 20 and the device wafer 1, 2 completely overlap when see from above prior to removing the exposed portion of the carrier wafer 20, FIG. 1E may also correspond to a top view onto the structured graphite carrier represented by the horizontal and vertical lines and the ring structure 20". The optional peripheral ring structure 20" of the structured graphite carrier increases mechanical stability.

Removing the exposed portion of the carrier wafer 20 may be done by ion beam etching and/or plasma etching.

For example, ion beam etching may be used to remove a SiC protecting layer of the carrier wafer 20. Plasma etching (in particular plasma ashing) may be used to remove the exposed graphite.

Further, exposed portions of the bond layer 42 may be removed using chemical etching to partly expose the device wafer 1, 2.

In embodiments in which the bond-layer 42 is made of highly conductive (n-doped, typically nitrogen-doped or phosphorus-doped) SiC, the bond layer 42 is typically not removed. Further, the hard mask 7 may be removed even prior to plasma etching. This is because the remaining portions of the SiC protecting layer may also be used as mask for plasma etching.

Alternatively, or in addition removing the exposed portion of the carrier wafer 20 may include one or more processes of milling and/or grinding the carrier wafer 20. For example, a cutter may be used to remove portions of the carrier wafer 20 except for thin remainders that are removed by plasma ashing stopping at the SiC on and/or at the device wafer 1, 2.

Openings of the SiC protecting layer on the on the residual 20' of the carrier wafer 20 (where graphite may be exposed) may be closed by depositing silicon and a thermal process.

After removing the exposed portion of the carrier wafer 20 and forming the structured graphite carrier 20', respectively, the reversible carrier 5 may be removed.

Thereafter, the device wafer may be further processed while the device wafer 1, 2 remains mechanically supported by the structured graphite carrier 20.

The formed wafer structure 40 may be described as a wafer structure including a device wafer 1, 2 typically comprising a wide band-gap semiconductor material, e.g. a silicon carbide wafer 1, 2, and a support structure 20' which is glue-bonded to the device wafer 1, 2, comprises or essentially consists of graphite, and leaves at least central portions of device areas D of the device wafer 1, 2 uncovered but surrounded when seen from above.

Prior to further processing, the formed wafer structure 40 may be stored and even shipped after suitable packaging.

Due to the small thermal mismatch between silicon and graphite, the structured graphite carrier 20' is also well suited as a support structure of silicon device wafers, in particular thin (e.g. less than 100 µm or even 50 µm thick) silicon device wafers. Accordingly, a method for forming semiconductor devices includes in an embodiment, providing a wafer stack 40 including a graphite carrier wafer 20 and a device wafer having a back-side 22 glue-bonded to the graphite carrier wafer 20, defining device regions D of the wafer stack 40, partly removing the carrier wafer 20 so that openings 25 are formed in the carrier wafer 20 arranged within respective device regions D and that the device wafer 1, 2 is supported by a residual 20' of the graphite carrier wafer 20, and further processing the device wafer 1, 2 while the device wafer 1, 2 remains supported by the residual 20' of the carrier wafer 20.

Prior to removing the reversible carrier 5, the openings 25 are typically filled with one or more conductive materials, typically metals or alloys, to form conductive regions electrically contacting areas of the second side 22 that are not covered by the structured graphite carrier 20'. Accordingly, a back-side metallization may be formed in each device area D which is typically in electric contact (more typically in ohmic contact) with the device wafer 1, 2. Such a back-side metallization is anyways to be formed for vertical semiconductor devices. The back-side metallization(s) further stabilizes the device wafer 1, 2. In addition, the thermal contact resistance between the device wafer 1, 2 and the support structure formed by the structured graphite carrier 20' and the back-side metallizations as well as the electrical resistance and the thermal contact resistance of the support structure is further reduced. This may facilitate further manufacturing. Furthermore, the thermal mass (also known as heat capacity and thermal capacity) is increased. Accordingly, the "inertia" against temperature fluctuations is increased.

In one (not illustrated) embodiment, the residual 20' of the carrier wafer 20 is completely removed after forming the back-side metallization(s). In this embodiment, the typically thick back-side metallization(s) may be used as support structure during further processing.

Forming the back-side metallizations in the openings 25 of the structured graphite carrier 20' has two further advantages. First, mechanical stress is reduced compared to forming a contiguous back-side metallization covering at least a major part of the device wafer 1, 2. Second, cutting or sawing through the back-side metallization is not required for singulating (see below).

Figure 3C:
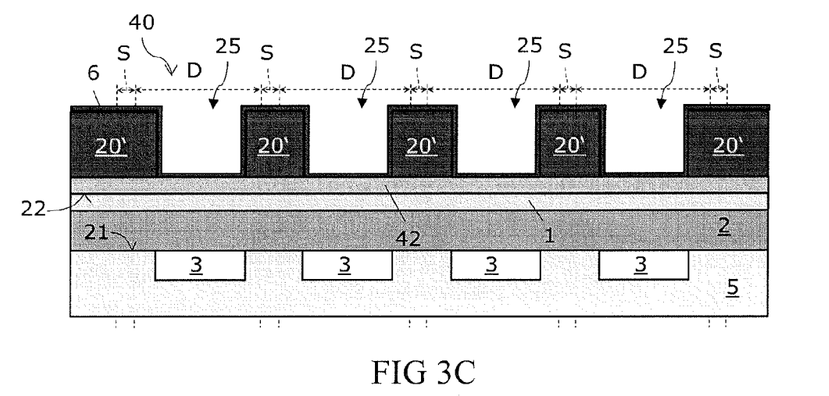

Forming the back-side metallizations in the openings 25 may include depositing a contact layer of e.g. NiSi. The contact layer may be activated by LTA (laser thermal anneal). Thereafter, a conformal seed layer 6 may be formed. The resulting wafer structure is illustrated in FIG. 3C.

The seed layer 6 may be formed by physical vapor deposition of e.g. Cu.

Prior to forming the seed layer 6, barrier layers such as (Ti, W, Ta, TaN, TiN, TaN, TiWN, Ru, or combinations of them) may be deposited. For sake of clarity, the contact layer and the barrier layers are not shown in FIG. 3C.

Figure 4A:
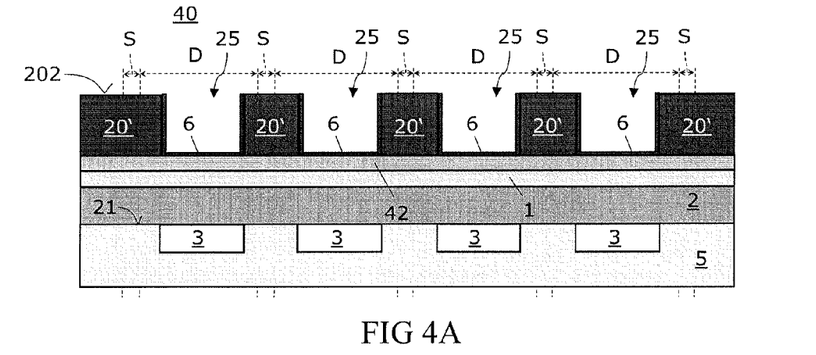
FIGS. 4A, 4B and 4C illustrate vertical cross-sections of wafer structures in accordance with an embodiment method.

As illustrated in FIG. 4A, the seed layer 6 may, except of an outer contact area, be removed from the upper side 202 of the structured graphite carrier 20', in particular in embodiments referring to an electrically conductive bond layer 42 providing electric contact between the seed layer portions 6 in the openings 25. However, the seed layer 6 may also be completely removed from the upper side 202 when the electric conductivity of the structured graphite carrier 20' is high enough.

Figure 4B:
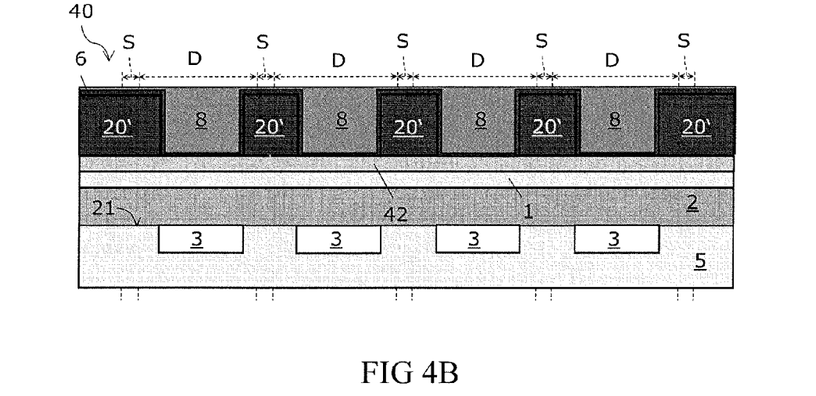

After forming the seed layer 6, the openings 25 may be filled with a further conductive region 8, typically a metal such as Cu or an alloy of high specific heat capacity and/or high density and/or low specific electric resistivity. The resulting wafer structure 40 is shown in FIG. 4B.

Filling the openings 25 may include electro-chemical plating, in particular pattern plating, i.e. forming a plating mask, electro-chemical plating and removing the plating mask, as well as optional processes of over-etching the seed layer 6 and a planarization (e.g. a CMP-process). Filling the openings 25 may also include printing a conductive paste, e.g. screen printing a sinterable metal paste, or inkjet printing. In these embodiments, no seed layer (6) is needed.

In embodiments referring to manufacturing of MOSFETs, the back-side metallization typically forms a drain metallization.

In embodiments referring to manufacturing of diodes, the back-side metallization typically forms a cathode metallization.

Figure 4C:
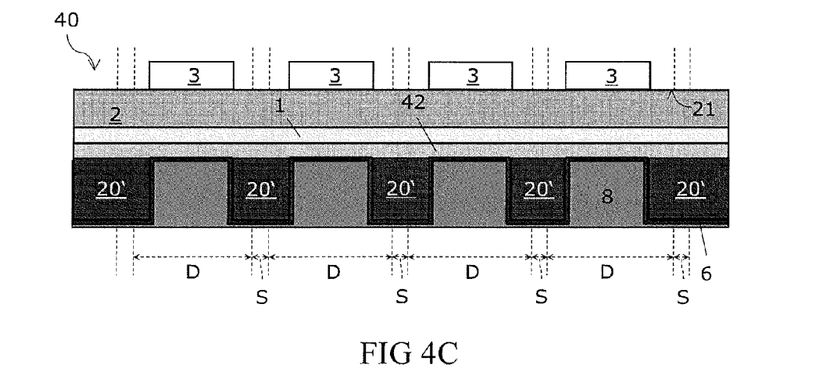

In a further process, the reversible carrier 5 may be removed. The resulting wafer structure 40 is shown in FIG. 4C. However, the seed layer 6 may also be partly removed or even not present at all, in particular when a mechanical filling technique such as printing is used for filling the openings 25.

Thereafter, the wafer structure 40 may be further processed. This may include thermal annealing.

Further processing may also include (individually) testing the functionality of the device regions D. For this purpose the formed back-side metallizations 6, 8 and the front-side metallizations 3 may be temporarily contacted.

For example, a blocking capability of a pn-diode, a barrier height of a Schottky-diode or integrity of a gate oxide formed in respective device regions D may be determined and tested, respectively.

When an electrically conductive bond layer 42 was formed, those tests may also be performed prior to forming the mask layer 7 which may also be formed after attaching the device wafer 1, 2 to the reversible carrier 5.

Testing the functionality may include processing control structures and/or electrical function tests.

Figure 5A:
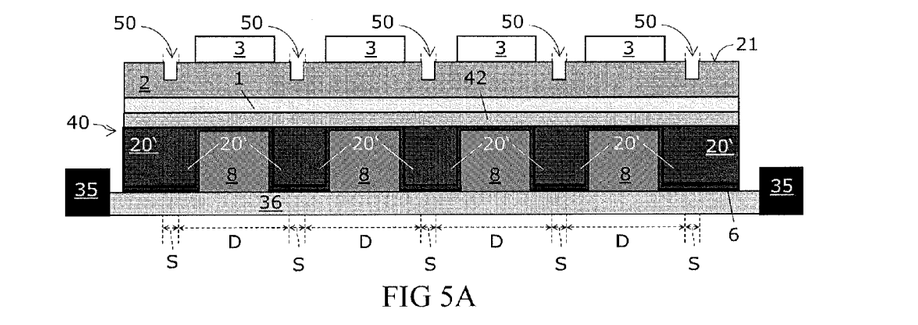
FIGS. 5A and 5B illustrate vertical cross-sections of wafer structures in accordance with an embodiment options to facilitate separation of the wafer structure into separate semiconductor chips.
Figure 5B:
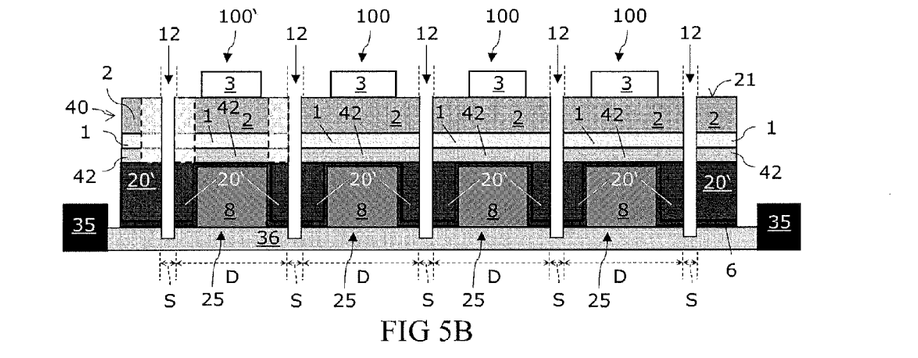

With regard to FIGS. 5A, 5B embodiments illustrating options to facilitate separation of the wafer structure 40 into separate semiconductor chips 100, 100' (singulating) are explained.

As shown in FIG. 5A, the wafer structure 40 may be attached to a foil 36 that is supported by a typically ring-shaped frame 35 so that the the structured graphite carrier 20' is arranged between the foil 36 and the device waver 1, 2. Accordingly, the front-side 21 of the device waver 1, 2 is typically accessible.

In one embodiment, the wafer structure 40 is laminated to the foil 36.

In addition, FIG. 5A shows the above described wide trenches 50 that may be formed prior to attaching the wafer structure 40 to the foil 36.

To protect the typically fragile wafer edge, an outer (peripheral), typically ring-shaped portion of the structured graphite carrier 20' may be thickened. After attaching the wafer structure 40 to the foil 36 and prior to the singulation process, the outer portion of the structured graphite carrier 20' may be removed or at least thinned, e.g. by means of mechanical or laser based technologies.

Subsequently, the device wafer 1, 2 and the semiconductor wafer structure 40, respectively, is diced along the predefined separation lines S.

For this purpose, separation trenches 12 may be formed or deepened from the front side 21.

As illustrated in FIG. 5B, the separation trenches 12 are typically formed such that they neither cut through the comparatively back-side metallizations 8 in the openings 25 nor through the front-side metallizations 3. This facilitate forming the separation trenches 12, in particular for device wafers 1, 2 made of or at least having layers of hard materials such as SiC. Note that cutting or sawing through metals such as Cu and hard materials such as SiC typically requires different process conditions and or tools unless a laser separation technique is used.

The separation trenches 12 are typically formed such that they extend from the front side at least partly into the structured graphite carrier 20', more typically through the structured graphite carrier 20' or even partly into the foil 36.

When the separation trenches 12 extend at least to the foil 36, the individual semiconductor chips or dies 100, 100' may simply be picked.

Otherwise, the wafer structure 40 may be separated into individual semiconductor chips or dies 100, 100' by breaking along the separation trenches 12.

The separation trenches 12 may completely be formed after attaching the wafer structure 40 to the foil 36.

In other embodiments, the separation trenches 12 are partly formed prior to attaching the wafer structure 40 to the foil 36. For example, the wide trenches 50 may be formed prior to attaching the wafer structure 40 to the foil 36. Alternatively or in addition, lower portions of the trenches 12 at least partially extending through the structured graphite carrier 20' may be formed prior to attaching the wafer structure 40 to the foil 36. The structured graphite carrier 20' may even be substantially or completely removed prior to attaching the wafer structure 40 to the foil 36.

All this ensures that the final separation does not occur through both the device wafer 1, 2 and the thick metallisation regions 8 in the openings 25.

As illustrated in FIG. 5B by the dashed rectangles next to the left semiconductor chip 100', the separation trenches 12 may have a larger (horizontal) width in the device wafer 1, 2 compared to the width in the structured graphite carrier 20'. Accordingly, the risk of forming cracks in the device wafer 1, 2 during singulating (in particular breaking) is reduced. For example, the semiconductor material above the structured graphite carrier 20' may be completely removed during forming the separation trenches 12 as indicated for the left semiconductor chip 100'. This results in particularly low risk of forming cracks in the device wafer 1, 2 during singulating or during subsequent handling of the separated chips.

Singulating the wafer stack into individual chips 100, 100' and forming the separation trenches 12 may include one or more of the following processes:
  plasma etching the structured graphite carrier 20' along scribe lines S after or prior to attaching the device wafer 1, 2 to the foil 36,
  etching from the first side 21 at least close to the structured graphite carrier 20',
  sawing or cutting from the first side 21 or the wide trench 50 at least close to the structured graphite carrier 20',
  scribing the device wafer 1, 2 along the predefined scribe lines S arranged within the structured graphite carrier 20' when seen from above and subsequent breaking,
  removing the device wafer 1, 2 in device regions D overlapping with the structured graphite carrier 20' when seen from above,
  laser cutting, and
  cutting or etching through the structured graphite carrier 20'.

The methods explained above were mainly explained with regard to SiC, but may also be used for forming GaN-devices and Si-devices.

Figure 5C:
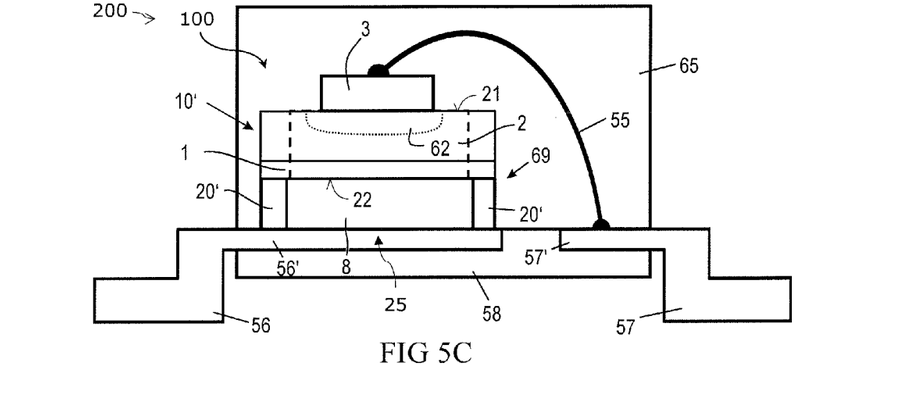
FIG. 5C illustrates a vertical cross-section through a semiconductor device according to an embodiment.

FIG. 5C illustrates a vertical cross-section through a semiconductor device 200 that may be manufactured using the methods explained above with regard to FIG. 1A to FIG. 5B.

In the exemplary embodiment, the semiconductor device 200 includes a semiconductor chip 100 with a semiconductor body 10' that may be formed by a portion of the divided device wafer 1, 2 shown in FIG. 5B.

The semiconductor body 10' extends between a first side 21 and a second side 22. A graphite substrate 20' is bonded to the second side 22 and has an opening 25 leaving an area of the second side 22 uncovered by the graphite substrate 20'. A back-side metallization 8 is arranged in the opening 25 and surrounded by the graphite substrate 20. The back-side metallization 8 electrically contacts the second side 22.

FIG. 5C illustrates an exemplary vertical two-terminal semiconductor device 200 with one front-side metallization 3 on the first side 21. Semiconductor device 200 may be a power diode. However, this is to be understood as a non-limiting example. Other examples include three-terminal devices such as FETs or IGBTs.

The semiconductor device 200 includes two terminals which are formed in this embodiment by lead structures 56 and 57. These lead structures extend laterally from a carrier substrate 58.

In the exemplary embodiment, the semiconductor body 10' has at least one doping region 62. The doping region 62 is formed at the first surface or side 21 and in electrical contact with the front-side metallization 3 disposed on the first surface 21. The front-side metallization 3 forms in this embodiment the anode of a power diode. The doping region 62 is oppositely doped to the material of the embedding upper semiconductor layer 2 which usually has a low n-doping concentration in case of power diodes. A lower semiconductor layer 1 adjoins the upper semiconductor layer 2. The lower semiconductor layer 1 is of the same doping type and the same semiconductor material (e.g. SiC) as the upper semiconductor layer 2. However, a doping concentration of the lower semiconductor layer 1 is typically higher compared to the upper semiconductor layer 2.

The back-side metallization 8 fills the opening 25 of the graphite substrate 20' and provides an ohmic contact between the lower semiconductor layer 1 and a pad structure 56' of the lead structure 56. The back-side metallization 8 forms in this embodiment the cathode of the power diode. A metallic seed layer (6) is not illustrated in this embodiment but can be provided if desired.

The back-side metallization 8 is typically made of or mainly made of Cu or another metal (Sn, Au, Ag, Al, Mo,) or alloy with high electric conductivity and high thermal mass.

An extension of the back-side metallization 8 in vertical direction (i.e. a direction perpendicular to the side 21, 22)

and in the openings 25 is typically in a range from about 500 nm to about 200 µm, for example in a range from about 50 µm to about 200 µm.

Accordingly, the back-side metallization 8 may also provide a heatsink of high thermal mass. This improves avalanche robustness, surge current strength and/or short-circuit strength of the semiconductor device 200.

The front-side metallization 3 may have the same or similar vertical dimensions and/or the same or a similar composition as the back-side metallization 8. Accordingly, the formation of so called hot spots during operating the semiconductor device 200 may be avoided or at least substantially reduced.

The front-side metallization 3 is electrically connected to a pad structure 57' of the lead structure 57 by a bond wire 55 or a clip bond (not shown).

Further, the semiconductor chip 100 is encapsulated in an insulating material 65 such as a cured epoxy resin (so-called hard casting) or a silicone gel (so-called soft casting). Accordingly, the semiconductor chip 100 is protected against moisture and/or mechanical damaging.

As indicated by the dashed vertical lines in FIG. 5C, the semiconductor body 10' may be completely arranged within the graphite substrate 20' when seen from above.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device comprising:
a plurality of semiconductor chips each comprising:
a semiconductor body having a first side and a second side opposite the first side and comprising a wide band-gap semiconductor material, the wide band-gap semiconductor material comprising silicon carbide or gallium nitride;
a graphite substrate bonded to the second side of the semiconductor body by a ceramic-forming polymer precursor and comprising an opening leaving an area of the second side of the semiconductor body uncovered by the graphite substrate;
a back-side metallization arranged in the opening of the graphite substrate, surrounded by the graphite substrate, and electrically contacting the area of the second side; and
a front-side metallization formed on the first side of the semiconductor body and electrically contacting the semiconductor body;
a foil attached to each of the plurality of semiconductor chips such that the graphite substrate of each of the plurality of semiconductor chips is arranged between at least a portion of the foil and the semiconductor body of each of the plurality of semiconductor chips;
a plurality of separation trenches, each of the plurality of separation trenches separating one of the plurality of semiconductor chips from an adjacent one of the plurality of semiconductor chips and extending vertically from a top surface of the semiconductor device through at least a portion of the foil; and
wherein:
the graphite substrate surrounds the semiconductor body when seen from above; or
the semiconductor body is completely arranged within the graphite substrate when seen from above.

2. A semiconductor device comprising:
a plurality of semiconductor chips each comprising:
a semiconductor body having a first side and a second side opposite the first side and comprising a wide band-gap semiconductor material;
a graphite substrate bonded to the second side of the semiconductor body and comprising an opening leaving an area of the second side of the semiconductor body uncovered by the graphite substrate;
a back-side metallization arranged in the opening of the graphite substrate, surrounded by the graphite substrate, and electrically contacting the area of the second side; and
a front-side metallization formed on the first side of the semiconductor body and electrically contacting the semiconductor body;
a plurality of separation trenches, each of the plurality of separation trenches separating one of the plurality of semiconductor chips from an adjacent one of the plurality of semiconductor chips; and
a foil attached to each of the plurality of semiconductor chips such that the graphite substrate of each of the plurality of semiconductor chips is arranged between at least a portion of the foil and the semiconductor body of each of the plurality of semiconductor chips.

3. A semiconductor device comprising:
a plurality of semiconductor chips each comprising:
a semiconductor body having a first side and a second side opposite the first side;
a graphite substrate bonded to the second side of the semiconductor body and comprising an opening leaving an area of the second side of the semiconductor body uncovered by the graphite substrate;
a back-side metallization arranged in the opening of the graphite substrate and electrically contacting the area of the second side; and
a plurality of separation trenches, each of the plurality of separation trenches separating one of the plurality of semiconductor chips from an adjacent one of the plurality of semiconductor chips.

4. The semiconductor device of claim 3, wherein the graphite substrate surrounds the semiconductor body when seen from above.

5. The semiconductor device of claim 3, wherein the semiconductor body is completely arranged within the graphite substrate when seen from above.

6. The semiconductor device of claim 3, wherein the semiconductor body comprises a wide band-gap semiconductor material.

7. The semiconductor device of claim 6, wherein the wide band-gap semiconductor material is silicon carbide or gallium nitride.

8. The semiconductor device of claim 3, further comprising a foil attached to each of the plurality of semiconductor chips such that the graphite substrate of each of the plurality of semiconductor chips is arranged between at least a portion of the foil and the semiconductor body of each of the plurality of semiconductor chips.

9. The semiconductor device of claim 3, further comprising a seed layer formed on a side of the graphite substrate, at least a portion of the seed layer arranged between the graphite substrate and the back-side metallization.

10. The semiconductor device of claim 3, further comprising a front-side metallization formed on the first side of the semiconductor body and electrically contacting the semiconductor body.

11. The semiconductor device of claim 3, wherein the semiconductor body is formed from a split layer and an epitaxial layer.

12. The semiconductor device of claim 1, wherein a doping concentration of the split layer is higher than a doping concentration of the epitaxial layer.

13. The semiconductor device of claim 3, wherein the semiconductor body has a thickness of less than 100 μm.

14. The semiconductor device of claim 3, wherein each of the plurality of separation trenches extends vertically from the first side of the semiconductor body through at least a portion of the graphite substrate.

15. The semiconductor device of claim 3, wherein each of the plurality of separation trenches extends vertically from the first side of the semiconductor body through at least a portion of the foil.

16. The semiconductor device of claim 3, wherein:
the semiconductor device is a MOSFET device; and
the back-side metallization is a drain of the MOSFET device.

17. The semiconductor device of claim 3, wherein:
the semiconductor device is a power diode; and
the back-side metallization is a cathode of the power diode.

18. The semiconductor device of claim 3, wherein a first width of a first portion of each of the plurality of separation trenches is greater than a second width of a second portion of each of the plurality of separation trenches.

19. The semiconductor device of claim 18, wherein:
the first portion of each of the plurality of separation trenches is arranged between the semiconductor body of the one of the plurality of semiconductor chips and the semiconductor body of the adjacent one of the plurality of semiconductor chips; and
the second portion of each of the plurality of separation trenches is arranged between the graphite substrate of the one of the plurality of semiconductor chips and the graphite substrate of the adjacent one of the plurality of semiconductor chips.

20. The semiconductor device of claim 3, wherein an extension of the back-side metallization in a vertical direction is between 500 nm and 200 μm.

* * * * *

UNITED STATES PATENT AND TRADEMARK OFFICE
CERTIFICATE OF CORRECTION

PATENT NO. : 10,020,226 B2
APPLICATION NO. : 15/645402
DATED : July 10, 2018
INVENTOR(S) : Roland Rupp Page 1 of 1

It is certified that error appears in the above-identified patent and that said Letters Patent is hereby corrected as shown below:

In the Claims

In Column 17, Line 32, Claim 12, delete "claim 1" and insert --claim 11--.

Signed and Sealed this
Twenty-fifth Day of September, 2018

Andrei Iancu
*Director of the United States Patent and Trademark Office*